(12) United States Patent
Rider

(10) Patent No.: US 7,691,547 B2
(45) Date of Patent: Apr. 6, 2010

(54) RETICLE CONTAINING STRUCTURES FOR SENSING ELECTRIC FIELD EXPOSURE AND A METHOD FOR ITS USE

(75) Inventor: Gavin Charles Rider, Avon (GB)

(73) Assignee: Microtome Precision, Inc., Colorado Springs, CO (US)

( * ) Notice: Subject to any disclaimer, the term of this patent is extended or adjusted under 35 U.S.C. 154(b) by 398 days.

(21) Appl. No.: 11/724,715

(22) Filed: Mar. 16, 2007

(65) Prior Publication Data

US 2007/0218667 A1 Sep. 20, 2007

Related U.S. Application Data

(60) Provisional application No. 60/782,928, filed on Mar. 16, 2006.

(51) Int. Cl.
*G03F 1/00* (2006.01)
*G03C 5/00* (2006.01)

(52) U.S. Cl. .............................. 430/5; 430/30
(58) Field of Classification Search ............ 430/5, 430/30; 324/457
See application file for complete search history.

(56) References Cited

U.S. PATENT DOCUMENTS

| 4,440,841 | A | 4/1984 | Tabuchi et al. |
|---|---|---|---|
| 5,798,192 | A | 8/1998 | King et al. |
| 5,989,754 | A | 11/1999 | Chen et al. |
| 6,180,291 | B1 | 1/2001 | Bessy et al. |
| 6,291,114 | B1 | 9/2001 | Reijers et al. |
| 6,309,781 | B1 | 10/2001 | Gemmink et al. |
| 6,440,617 | B1 | 8/2002 | Deng et al. |
| 6,569,576 | B1 | 5/2003 | Hsueh et al. |
| 6,803,156 | B2 | 10/2004 | Akbar |
| 2002/0115001 | A1 | 8/2002 | Hsue et al. |
| 2003/0052691 | A1 | 3/2003 | Kraz |
| 2004/0076834 | A1 | 4/2004 | Su et al. |
| 2004/0169516 | A1* | 9/2004 | Kraz ....................... 324/457 |

FOREIGN PATENT DOCUMENTS

| JP | 60222856 | 11/1985 |
|---|---|---|
| JP | 62293244 | 12/1987 |
| JP | 2002/055438 | 2/2002 |
| JP | 2004/061884 | 2/2004 |
| KR | 0196585 | 12/2000 |
| KR | 0057347 | 7/2001 |
| KR | 0422907 | 3/2004 |
| TW | 441071 B | 6/2001 |
| TW | 543178 B | 7/2003 |
| WO | WO 2004/032208 | 4/2004 |

* cited by examiner

*Primary Examiner*—Stephen Rosasco
(74) *Attorney, Agent, or Firm*—Patton Boggs LLP

(57) ABSTRACT

A reticle includes an image area having one or more electrically conductive portions susceptible to damage by an electric field and an electric field sensor feature, the sensor feature adapted to be at least as susceptible to being altered by the electric field as the electrically conductive portions of the image area, the sensor feature being located in a position which is more readily viewable to show alteration than the electrically conductive portions of the image area.

11 Claims, 4 Drawing Sheets

RETICLE CONTAINING STRUCTURES FOR SENSING ELECTRIC FIELD EXPOSURE AND A METHOD FOR ITS USE

CROSS-REFERENCE TO RELATED APPLICATIONS

This application claims the benefit of U.S. Provisional Application Ser. No. 60/782,928 filed Mar. 16, 2006, which application is hereby incorporated by reference to the same extent as though fully disclosed herein.

FIELD OF INVENTION

This application relates to the field of photomasks, referred to in the trade as reticles, used in the production of semiconductor devices, and more particularly to such reticles that are sensitive to electrical fields.

BACKGROUND OF THE INVENTION

Transmission photomasks (reticles) used in the production of semiconductor devices are often constructed using conductive metallic films (for example, chromium), or other films, such as MoSiON, deposited onto a transparent substrate, such as quartz. A pattern is etched into this film and then is projected by photo-reduction onto a semiconductor wafer coated with a photosensitive layer. By this means, a replica of the pattern on the reticle is produced in the film on the semiconductor wafer, which replica is greatly reduced in size. Through further and repeated processing of the wafer, a three-dimensional microcircuit is built up.

Such reticles may contain a multitude of isolated conductive features supported on an electrically insulating substrate. These conductive features, which together make up the pattern that is to be projected onto the wafer, can have differing electrical potentials induced on them if the reticle is placed into an electric field. The presence of differing electric potentials on neighboring conductive features can cause electrical discharge between the features in a process that is referred to as field-induced electrostatic discharge (ESD). Furthermore, the features may also be damaged by such induced potentials even when an electrostatic discharge does not take place in a process referred to as electric field-induced material migration (EFM).

The degree of damage that a reticle will suffer as a result of such exposure to an electric field is difficult to predict, since the induction process is dependent upon the detailed structure of the pattern on the reticle, its orientation with respect to the electric field, and its proximity to surrounding objects which might perturb the electric field and concentrate such field through certain areas of the pattern. This makes it difficult to define how frequently a reticle should be inspected for damage in normal use to prevent production of defective wafers. Furthermore, any electric field-induced damage that is sustained by a reticle maybe subtle, highly localized, and difficult to detect during routine reticle inspections. Even though the damage may not be detected in the reticle inspection tool, it may affect the lithographic process.

The damage to the reticle may cause the image projected on the wafer to deviate from that which is expected and which is required for correct functioning of the finished semiconductor device. This is referred to as Critical Dimension (CD) deviation. When a reticle becomes damaged in such a way, defective devices can be produced; and this may not be discovered until the complete device has been built and is tested. Discovery of defects at this late stage in the production process results in significant financial losses to the semiconductor industry.

Electrostatic damage to reticles has been such a prevalent factor in semiconductor production for many years that various novel approaches have been suggested for countering it. In 1984, U.S. Pat. No. 4,440,841 described one of the first methods for making a reticle with an integral conductive layer capable of dissipating electrostatic charge. In 1985, JP Patent No. 60,222,856 described a means of connecting the various mask elements with filamentary conductive lines to avoid potential differences between them. Since those first two approaches, many variants involving conductive coatings, featuring interconnects, and charge dissipating structures have been proposed (e.g., JP Patent No. 62,293,244 (1987); U.S. Pat. No. 5,798,192 (1998); U.S. Pat. No. 5,989,754 (1999); KR Patent No. 196,585Y (2000); U.S. Pat. No. 6,180,291 (2001); TW Patent No. 441,071 (2001); KR Patent Publication No. 2001/057347 (2001); U.S. Pat. No. 6,291,114 (2001); U.S. Pat. No. 6,309,781 (2001); JP Patent Publication No. 2002/055438 (2002); US Patent Publication No. 2002/0115001(2002); U.S. Pat. No. 6,440,617 (2002); U.S. Pat. No. 6,569,576 B1 (2003); TW Patent No. 543,178 (2003); KR Patent Publication No. 2003/085946 (2003); JP Patent Publication No. 2004/061884 (2004); US Patent Publication No. 2004/076834 (2004); and U.S. Pat. No. 6,803,156 (2004)). These solutions increase the complexity and cost of reticle manufacture, plus they add process steps which can introduce defects or inhomogeneity to the reticle. Coatings may delaminate, or they may be easily damaged during handling and reticle cleaning. Furthermore, some of the coatings that have been suggested may degrade due to exposure to energetic UV light that is used in today's leading edge lithography systems; hence, their transparency may alter with time. All of these potential problems probably explain why such solutions are not in widespread use today and why reticle ESD damage continues to be a problem in the semiconductor manufacturing industry.

If the reticle itself cannot be made inherently ESD protected, an alternative solution is to enclose the reticle inside a conductive container, which will provide ESD protection by shielding the reticle from electric fields. Such a solution is described in PCT Publication No. WO 2004/032208. This will protect the reticle while it is inside the container; but semiconductor manufacturing requires the reticle to be moved outside the container on many occasions, during which time the reticle might be exposed to electric fields. Since electric field exposure during normal use of the reticle may gradually change the image on the reticle in a way that is detrimental to the final device that is being manufactured, it is important to be able to monitor a reticle's exposure to electric fields.

US Patent Publication No. 2003/0052691 describes a portable, compact sensor device that is capable of detecting the ESD events in a semiconductor manufacturing facility through their radio emissions. This has been suggested as a means of detecting ESD events in reticles by placing a sensor in the reticle handling environment or in/on the reticle carrier. However, such RF pulse sensing devices can only report the ESD event after the reticle is damaged, and EFM cannot be detected since there is no electrical discharge event. They also are likely to be sensitive to false alarms, owing to the highly charged nature of a semiconductor manufacturing facility.

A more effective and reliable means is required for routinely sensing whether a reticle has been exposed to an electric field. Such a sensor that could warn of a hazardous exposure before the reticle itself becomes damaged would be very desirable.

BRIEF SUMMARY OF THE INVENTION

The present invention advances the reticle art by solving one or more of the above problems.

The coupling of an electric field through a reticle is strongly affected by the presence of a continuous conductive border on the substrate. Such a border normally is present to prevent unwanted light from passing into the optical system of the lithography tool that is being used to print the reticle image onto the semiconductor wafer. This border sometimes is referred to as a "guard ring"; and it may also contain other structures such as alignment marks, bar codes, and human readable codes for identification of the reticle. It is separated from the image area by a clear space, and this electrically isolates the features in the image area from the guard ring.

Owing to the nature of the interaction of the guard ring with any electric field that impinges on the reticle, the electric field is perturbed such that its direction and strength are altered. A feature of the invention is that this interaction preferably is such that the field strength within the plane of the reticle is greatest in the region of the image closest to the guard ring. Thus, any electric-field-induced damage that the reticle suffers should be most severe in these areas. Thus, the guard ring may concentrate any electric field that is present in the environment surrounding the reticle and "focus" it onto this region.

The invention involves placing special structures that will be visibly damaged by electric fields at suitable locations within the gap between the guard ring and the image area of the reticle. These structures are likely to become damaged more readily than the features in the image area of the reticle, owing to their position in the most field-sensitive area of the reticle.

Regular reticle inspections for the effects of electric field exposure can be carried out by looking at these sensor structures rather than by inspecting the entire image area. Any deviation of these sensor patterns from normal will indicate that the reticle has been exposed to a hazardous electric field and should be inspected thoroughly to determine that all the functional reticle features are still within specification.

The invention provides a reticle comprising: an image area having one or more electrically conductive portions susceptible to damage by an electric field; and an electrical field sensor feature, the sensor feature adapted to be at least as susceptible to being altered by the electric field as the electrically conductive portions of the image area, the sensor feature being located in a position which is more readily viewable to show alteration than the electrically conductive portions of the image area. Preferably, the reticle further comprises a guard ring comprising an electrically conductive element located around the periphery of the image area and separated from the image area by an insulating gully, and wherein the damage sensor feature is located in the gully between the image area and the guard ring. Preferably, the guard ring substantially encloses the image area in a two-dimensional plane. Preferably, the guard ring comprises chrome. Preferably, the sensor feature comprises one or more electrically isolated structures oriented to provide sensitivity to the direction of the electric field. Preferably, the sensor feature comprises a target structure of standardized shape and size that may be used for automated inspection in a reticle inspection tool. Preferably, a plurality of the sensor features are disposed around the periphery of the image area to provide the ability to detect and differentiate electric fields impinging on the reticle from a plurality of directions. Preferably, the sensor features are placed in sufficient quantity to adequately sense electric fields impinging on the reticle from various directions, while also being of a minimum quantity to maximize the effect of the electric field on each sensor feature. Preferably, the one or more sensor features are designed to amplify the potential gradient or electric field in the region of the sensor feature.

The invention also provides a method for monitoring the condition of a reticle having an image area, the method comprising: providing one or more sensor features that are capable of being altered by the presence of an electric field, the sensor features being separate from the image area; and detecting whether any of the one or more of the sensor features have been altered. Preferably, the method further comprises, upon detecting the alteration, inspecting the image area for electric-field-induced damage. Preferably, the method further includes recording the inspection result in an inspection log. Preferably, the method further includes amplifying the potential gradient or electric field at the position of the one or more sensor features. Preferably, the method further includes recording the result of the detecting in an inspection log. Preferably, the method further comprises repeating the detecting after a prescribed period of use of the reticle. Preferably, the method further comprises inspecting the sensor features to determine their condition before use.

In another aspect, the invention provides a computer readable medium including a software or firmware program having instructions for inspecting a reticle, the reticle including an image, the program including instructions for: detecting the alteration of one or more electrical field sensor features on the reticle, the electrical field sensor features being separate from the image; and upon detecting the alteration of the one or more sensor features, providing instructions for inspecting the image area for electric-field-induced damage. Preferably, the instructions further include instructions for inspecting the reticle to establish the condition of the one or more sensor features before use. Preferably, the instructions further include instructions for repeating the detecting after a prescribed period of use of the reticle.

In yet another aspect, the invention provides a computer readable medium including a software or firmware program having instructions for inspecting a reticle, the reticle including an image, the program including instructions for detecting whether one or more of electrical field sensor features have been altered, the electric field sensor features being separate from the image; and recording the result of the detecting in an inspection log.

Remarkably, the invention provides inspection apparatus and processes in which ESD and EFM damage can be detected more effectively and at the same time is faster and more economical than the prior art. Numerous other features, objects, and advantages of the invention will become apparent from the following description when read in conjunction with the accompanying drawings.

DETAILED DESCRIPTION OF THE INVENTION

Figure 1:
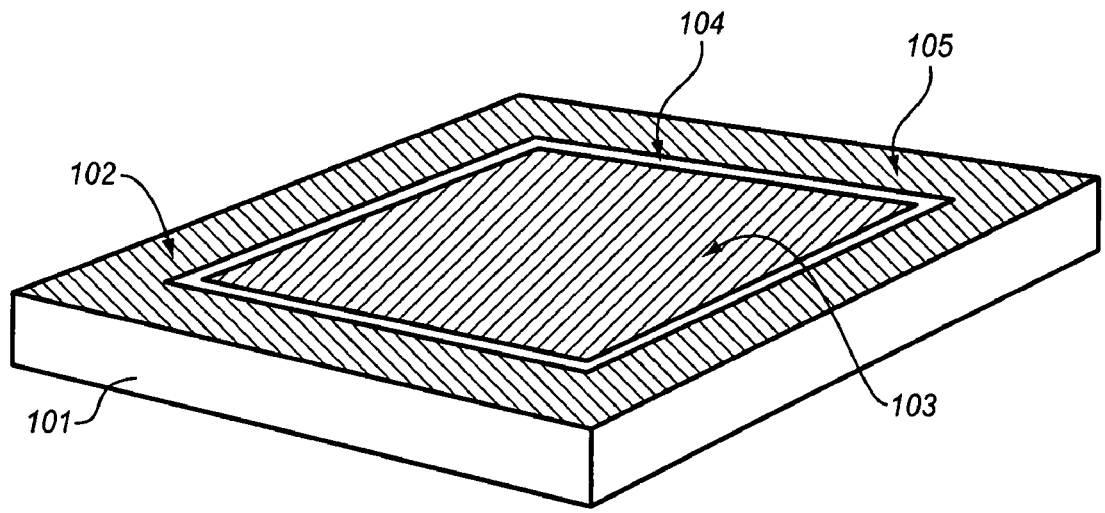
FIG. 1 is a perspective view of a prior art reticle.

A standard reticle structure characteristic of the prior art is shown in perspective view in FIG. 1. The insulating substrate 101 is coated on one of its major surfaces with a conductive light-absorbing film 102 into which is etched a pattern, herein referred to as the image area 103. The image area 103 is surrounded by a clear space 104, herein referred to as the gully, which separates the image area 103 from the continuous border, herein referred to as the guard ring 105. Film 102 preferably is made by a deposition process, which is known in the art. All the features 103, 104, and 105 are made by etching the film 102 during manufacture of the reticle. Sometimes, the conductive light-absorbing film is coated with an anti-reflection layer to improve optical performance in the lithography tool. This does not affect the interaction of the reticle with electric fields.

Figure 2:
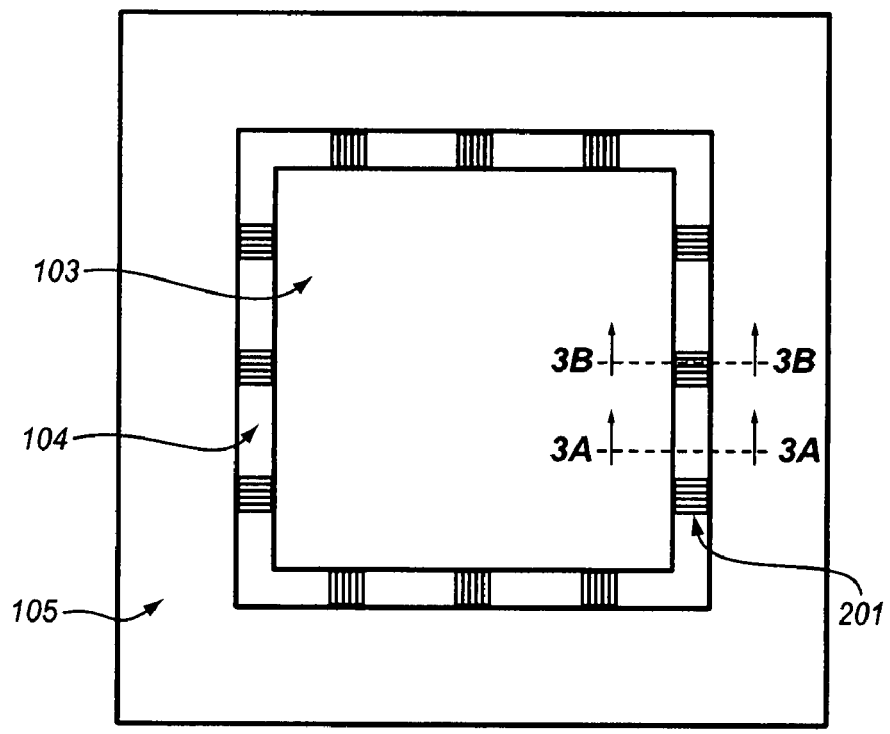
FIG. 2 is a plan view of a reticle according to the invention.

An embodiment of the invention is shown in plan view in FIG. 2. One or more electric field sensing features 201 are placed in gully 104 between the image area 103 and the guard ring 105. These features preferably are defined on the surface of the reticle when the mask pattern is written and are created when the film 102 is etched to form features 103, 104, and 105. Since an electric field that penetrates the reticle may come from any direction, preferably, multiple sensor structures are positioned around the periphery of the image area 103. Preferably, the number of structures so placed is sufficient to adequately sense all incident electric field directions relative to the reticle, but is kept to a minimum so that induced current passing through and between the sensing features 201 is not averaged over a large number of the sites, which would reduce the magnitude of the effect on each individual feature. That is, the effect of an electric field is maximized on as few as possible of the sensing features 201, thereby maximizing the visibility of changes to the features with the lowest possible strength of electric field interacting with the reticle.

Figure 3A:
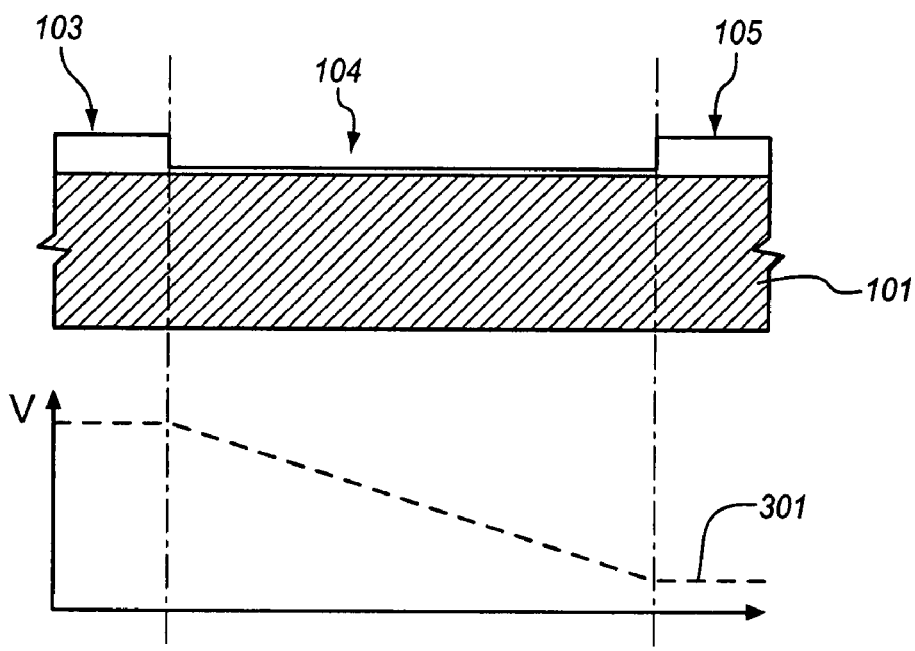
FIG. 3A is a cross-sectional view of the reticle of FIG. 2 taken through the line 3A-3A of FIG. 2.
Figure 3B:
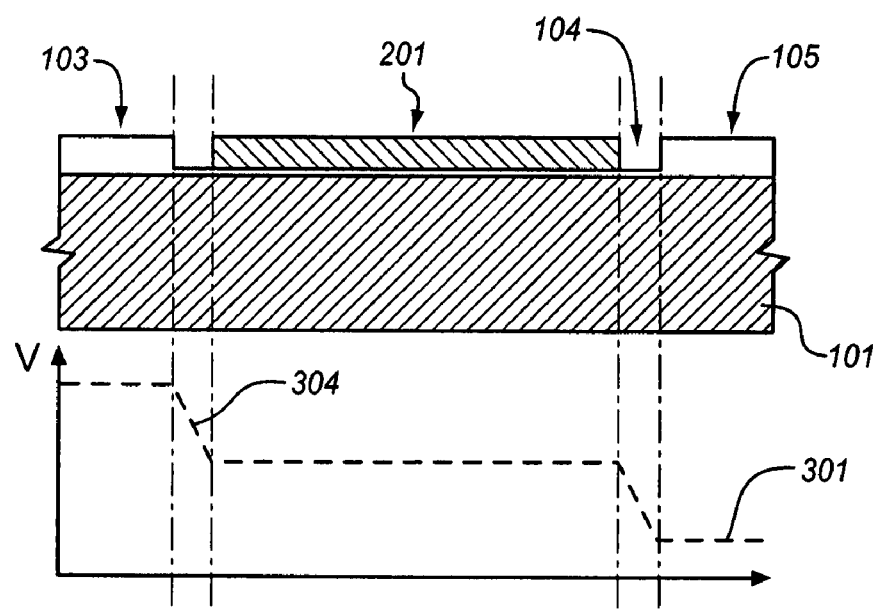
FIG. 3B is a cross-sectional view of the reticle of FIG. 2 taken through the line 3B-3B of FIG. 2.

The operation of the sensing features is explained in reference to FIGS. 3A and 3B. FIG. 3A represents a cross-section through the reticle at the place indicated by the dotted line 3A-3A in FIG. 2. Dashed line 301 represents the potential gradient or the electric field that would be present across the gully 104 when the reticle is placed into an environment containing an electric field. The direction of the field is arbitrary. With no features in the gully 104, the potential gradient and the electric field across the gully is represented by the gradient of the graph 301 in the lower section of the figure. Features 103 and 105 are at different induced potentials due to the presence of the external electric field. When the sensing feature 201 is placed into the gully in such a situation, as shown in FIG. 3B, it will adopt a potential which is intermediate between the potentials of 103 and 105. Thus, the potential gradient or electric field strength 304 at the gully region 104, which is already the most sensitive area of the reticle, is amplified by the presence of the sensing features. If the field strength and induced potential differences within the image area 103 are below the level where significant changes are caused to the reticle image features, this amplification of the same electric field by the sensing features in the gully may render them liable to change. Hence, they may indicate the existence of a hazard in the reticle handling environment before significant damage is caused to the reticle image area 103.

Figure 4:
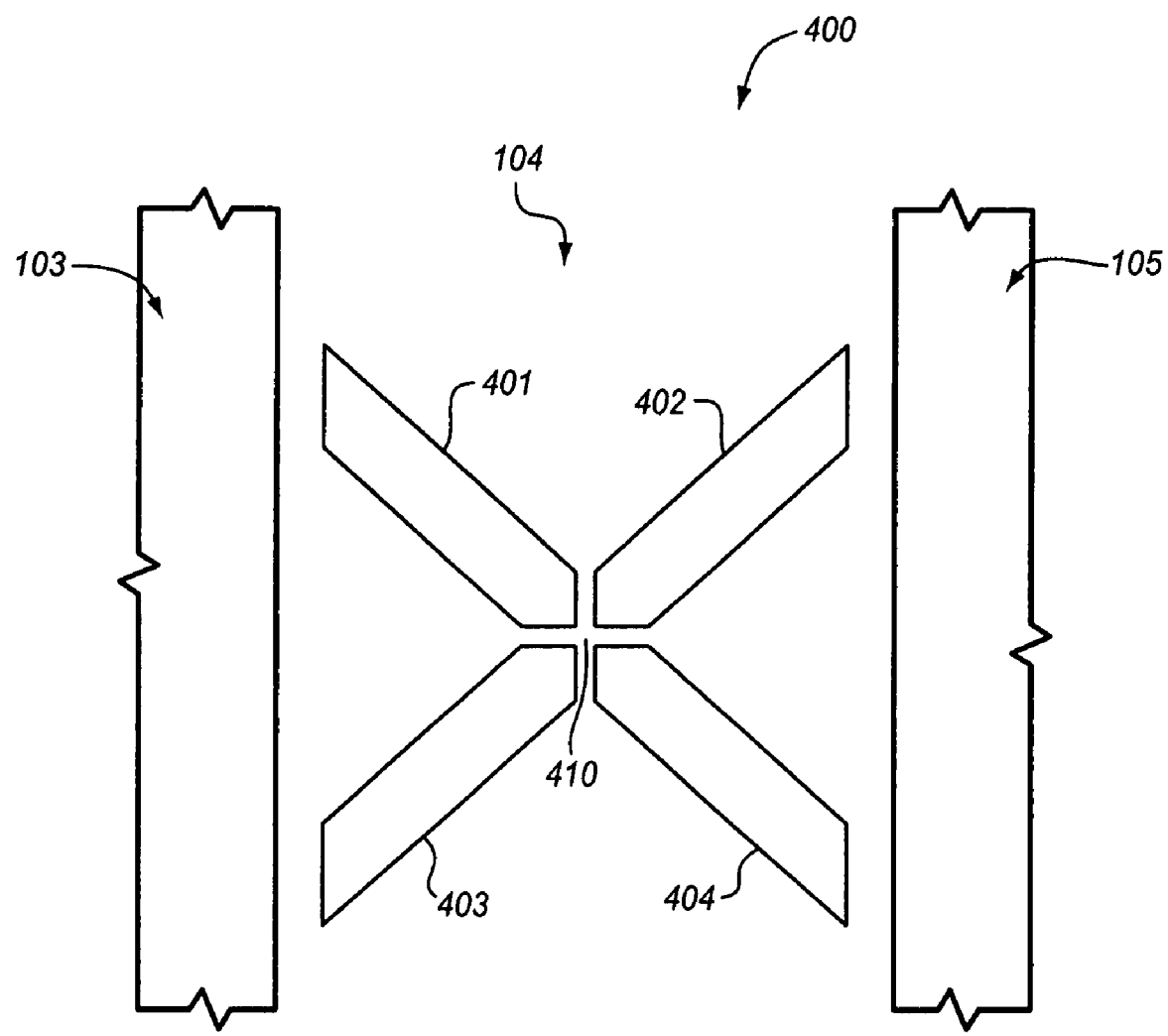
FIG. 4 is a plan view showing a detail of an alternative preferred embodiment according to the invention.

The sensing feature 201 in FIGS. 2 and 3 contains at least one conductive body 201 which partially spans the gully 104 between the image area 103 and the guard ring 105. However, other variants of the sensing feature are possible. Such an alternative preferred embodiment is shown in FIG. 4. In this embodiment, the sensing feature 400 comprises four parts, 401, 402, 403, and 404, spatially oriented so that they will respond differently to environmental electric fields passing at different angles across the gully 104. The central intersection 401 of these four structures forms a convenient target for use in an automated inspection microscope. Such an image can be automatically inspected and compared against the previous inspection image stored in a database. Any variation in the appearance of this feature will indicate that the reticle has been exposed to an electric field, and the image area 103 should be inspected carefully for possible damage.

Figure 5:
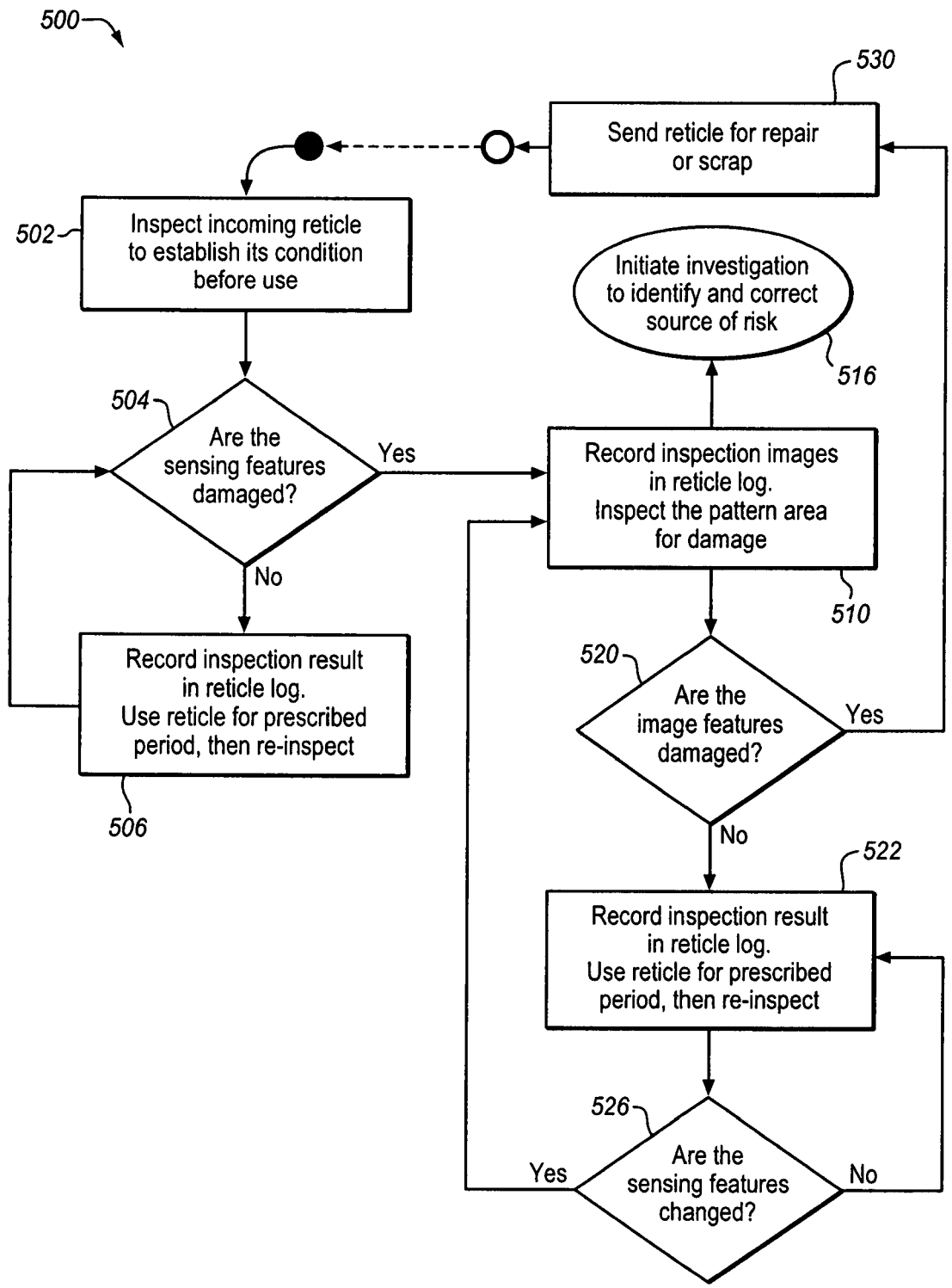
FIG. 5 is a flow chart showing a preferred embodiment of an inspection process according to the invention.

A flow chart illustrating an example of the method 500 that would apply to this form of inspection regime is given in FIG. 5. At 502, the reticle is inspected to establish its condition, and particularly the condition of the sensing features, before use. A determination of whether the sensing features are damaged is made at 504 and, if there is no damage, the result is recorded in a reticle log and the reticle is used for a prescribed period and the process returns to 504 where it is redetermined if the features are damaged. If damage is found in the sensing features at any point, the process proceeds to 510. The inspection images are recorded and at 516 an investigation is initiated to identify and correct the source of risk The pattern area is also inspected for damage at 510. If damage to the image features is detected at 520, the reticle is directed to 530 for repair or scrap. If the image features are not damaged, the inspection result is recorded in the reticle log at 522, the reticle is then used for a prescribed period, and then reinspected. The prescribed period of use may be set for a shorter period when, for example, there have been recent changes to a manufacturing process, and then for a longer period once the problem areas have been worked out in a manufacturing process. If a change in the image features is found at 526, the program returns to 510 and the cycle is repeated. If there is no change in the sensing features, the program returns to 522 where it is again used and reinspected. In this way, a rapid assessment may be conducted of the condition of a reticle with regard to any electrostatic hazard it may have experienced since its last inspection. Minimal data processing is required, with reduction of the need to regularly inspect the entire image area of the reticle. Hence, the process will occupy a minimum amount of inspection tool time and operator workload. At the same time, it is more sensitive to damage, since damage to the sensing areas is easier to detect. Since the same sensing features may be printed on all reticles, the process can be automated and the above processes can be incorporated into software instructions in a computer program on a computer readable medium.

There has been described apparatus and methods for quickly and effectively determining if a reticle has suffered ESD or EFM damage. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, it is also evident that the steps recited may, in some instances, be performed in a different order; or equivalent structures and processes may be substituted for the various structures and processes described; or a variety of different precursors may be used. Consequently, the invention is to be construed as embracing each and every novel feature and novel combination of features present in and/or possessed by the reticle protection and damage determination processes, the devices to perform such functions, and electronic device manufacturing methods described.

What is claimed as new and desired to be protected by Letters Patent of the United States is:

1. A method for monitoring the condition of a reticle having an image area, said method comprising:
   providing one or more sensor features that are capable of having their appearance altered by the presence of an electric field, said sensor features being separate from said image area; and
   visually or optically detecting whether the appearance of any of said one or more of said sensor features have been altered.

2. A method as in claim 1, said method further comprising, upon detecting said alteration, inspecting said image area for electric-field-induced damage.

3. A method as in claim 2, and further including recording said inspection result in an inspection log.

4. A method as in claim 1, and further including amplifying said potential gradient or electric field at the position of said one or more sensor features.

5. A method as in claim 1, and further including recording the result of said detecting in an inspection log.

6. A method as in claim 1, and further comprising repeating said detecting after a prescribed period of use of said reticle.

7. A method as in claim 1, and further comprising inspecting said sensor features to determine their condition before use.

8. A computer readable medium including a software or firmware program having instructions for inspecting a reticle, said reticle including an image, said program including instructions for:
   optically detecting the alteration of the appearance of one or more electric field sensor features on said reticle, said electric field sensor features being separate from said image; and
   upon detecting said alteration of said appearance of said one or more sensor features, providing instructions for inspecting said image area for electric-field-induced damage.

9. A computer readable medium as in claim 8 wherein said instructions further include instructions for inspecting the appearance of said reticle to establish the condition of said one or more sensor features before use.

10. A computer readable medium as in claim 8 wherein said instructions further include instructions for repeating said detecting after a prescribed period of use of said reticle.

11. A computer readable medium including a software or firmware program having instructions for inspecting a reticle, said reticle including an image, said program including instructions for:
    optically detecting whether the appearance of one or more of electric field sensor features have been altered, said electric field sensor features being separate from said image; and
    recording the result of said detecting in an inspection log.

* * * * *